US012658234B2

(12) United States Patent
Maddah et al.

(10) Patent No.: US 12,658,234 B2
(45) Date of Patent: Jun. 16, 2026

(54) DYNAMIC WRITE SELECTION FOR SHELF-LIFE RETENTION IN NON-VOLATILE MEMORIES

(71) Applicant: Intel Corporation, Santa Clara, CA (US)

(72) Inventors: Rakan Maddah, Portland, OR (US); Mu Lim Edwin Cheng, Folsom, CA (US); Bei Wang, El Dorado Hills, CA (US); Prashant S. Damle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 17/818,553

(22) Filed: Aug. 9, 2022

(65) Prior Publication Data

US 2022/0383941 A1     Dec. 1, 2022

(51) Int. Cl.
*G11C 11/406* (2006.01)
*G11C 11/4076* (2006.01)
*G11C 11/4096* (2006.01)

(52) U.S. Cl.
CPC .... *G11C 11/40615* (2013.01); *G11C 11/4076* (2013.01); *G11C 11/4096* (2013.01)

(58) Field of Classification Search
CPC .......... G11C 11/40615; G11C 11/4076; G11C 11/4096; G11C 11/5678; G11C 2213/75; G11C 13/003; G11C 13/0069; G11C 13/0061; G11C 13/0033
See application file for complete search history.

(56) References Cited

U.S. PATENT DOCUMENTS

| | | | |
|---|---|---|---|
| 8,775,874 B2 * | 7/2014 | Chu | ..................... G06F 12/0246 |
| | | | 714/36 |
| 9,460,778 B2 | 10/2016 | Son et al. | |
| 11,923,016 B2 | 3/2024 | Madraswala et al. | |
| 2018/0059933 A1 * | 3/2018 | Helmick | ............... G06F 3/0683 |

* cited by examiner

*Primary Examiner* — Sultana Begum
(74) *Attorney, Agent, or Firm* — Compass IP Law PC

(57) ABSTRACT

Systems, apparatuses and methods may provide for technology that determines a power-off period associated with a non-volatile memory (NVM), sets a completion time of a write procedure corresponding to the NVM to a first value if the power-off period exceeds a threshold, and sets the completion time to a second value if the power-off period does not exceed the threshold, wherein the first value is greater than the second value.

20 Claims, 5 Drawing Sheets

Shorter Completion Time     Longer Completion Time
(Selectively Activated)

10

Shorter Completion Time                    Longer Completion Time
                                           (Selectively Activated)

<u>50</u>

DYNAMIC WRITE SELECTION FOR SHELF-LIFE RETENTION IN NON-VOLATILE MEMORIES

TECHNICAL FIELD

Embodiments generally relate to non-volatile memory (NVM). More particularly, embodiments relate to dynamic write selection for shelf-life retention in non-volatile memories.

BACKGROUND

Phase change memory (PCM) technology may enable NVM to store data for long periods of time (e.g., ten years at room temperature), while operating almost as fast as high-performance volatile memory such as dynamic random access memory (DRAM). Phase change devices, however, have an intrinsic drift property causing the cell threshold voltage (Vt) to increase with time. A write operation recovers the threshold voltage and resets the drift time clock. During active usage, the threshold voltage drift may be managed through a background refresh operation policy in which at least one write is guaranteed to occur based on a specified refresh period. Conversely, the threshold voltage drift is typically not managed during power-off or shelf-time usage cases, causing the cell threshold voltage to drift significantly. Conventional solutions to addressing threshold voltage drift after a long power-off period may reduce the bandwidth of the NVM.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
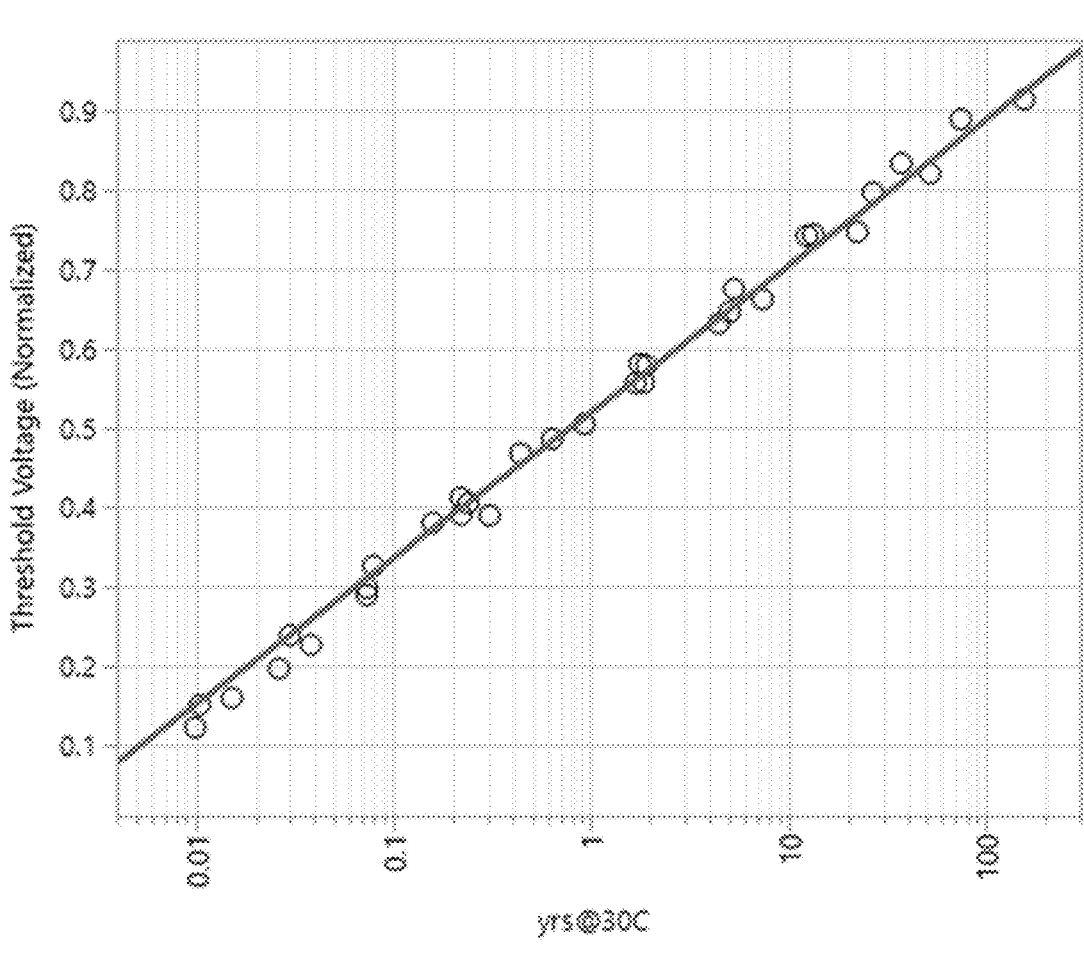
FIG. 1 is a chart of an example of a threshold voltage plot in a phase change device over time according to an embodiment.

Turning now to FIG. 1, a chart 10 demonstrates that the threshold voltage (Vt) of a phase change device monotonically increases with the time from the last write operation. As already noted, threshold voltage drift in NVM after long power-off periods may lead to performance problems. One of the issues limiting product retention capability is selection fail after a long power-off period. The selection fail is caused by the storage device driver not being able to deliver enough voltage to select high Vt bits (e.g., turning on the bit through applying voltage higher than the Vt of the cell). The high Vt is caused by a long drift time. The issue is worse for cells further from the driver with a higher current times resistance (IR) drop through the bit-line or the word-line. Indeed, the IR drop worsens with a higher leakage through the cell (e.g., vertical cell leakage is the leakage current through all cells, where every cell will have leakage current as long as there is voltage applied) or a larger tile size (e.g., number of cell bits sharing a word-line/WL and bit-line/BL), which are advantageous for cost optimization.

Figure 2:
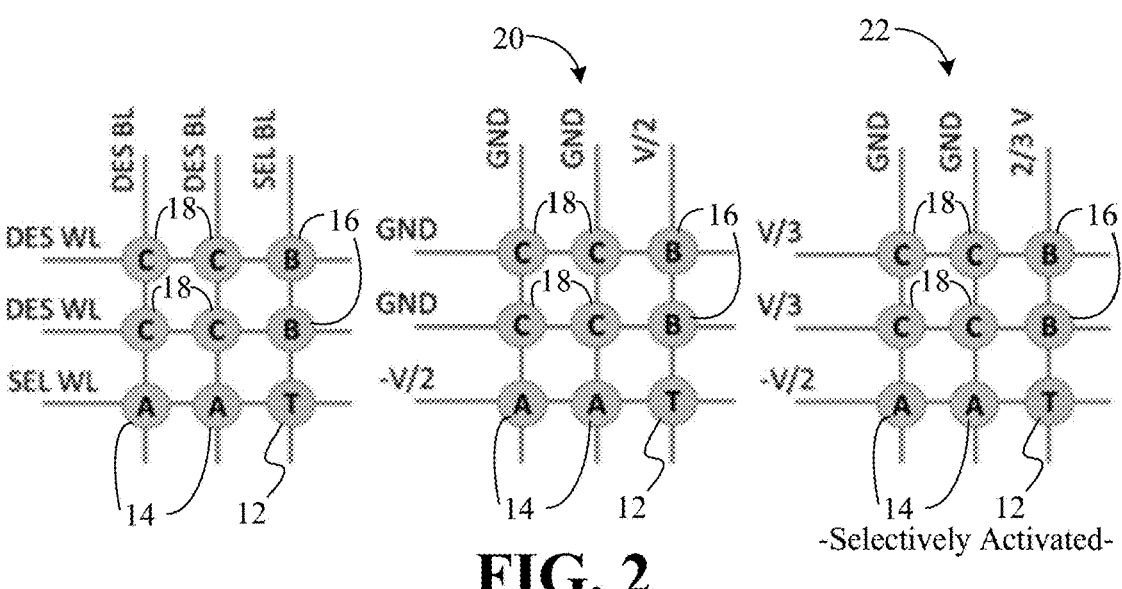
FIG. 2 is a comparative illustration of an example of a group of conventional memory cells and a group of enhanced memory cells according to an embodiment.

FIG. 2 shows a group of memory cells including a target cell 12 (T), unselected cells 14 (A) sharing a selected word-line (SEL WL) with the target cell 12, unselected cells 16 (B) sharing a selected bit-line (SEL BL) with the target cell 12, and unselected cells 18 (C) on deselected word-lines (DES WL) and deselected bit-lines (DES BL). In a normal operation instance 20, the target cell 12 has a threshold voltage "V". Thus, a half-voltage scheme applies V/2 on the selected BL and −V/2 on the selected WL. In this case, the unselected cells 14, 16 (A/B) cells receive V/2 and the unselected cells 18 (C) receive 0V (e.g., ground/GND).

To improve data retention, an enhanced operation instance 22 provides a higher voltage to the target cell 12 in cases of threshold voltage drift due to long power-off periods. One way to increase the voltage at the target cell 12 is to increase the voltage on the selected BL, from V/2 to ⅔ V as an example, but similar results may be achieved from the WL side. To avoid increasing vertical leakage for the unselected cells 16 (B), a bias of V/3 is applied to the unselected WLs of the unselected cells 18 (C). Switching the C-cell bias from ground to V/3 increases the charging time and power draw due to a high capacitance for all unselected WLs in the tiles that receive the C-cell bias. Thus, there is a trade-off between operation time, power consumption (e.g., product performance) and retention capability. Since after one write operation, the threshold voltage recovers, the longer operation time and/or higher power consumption is only present in the first write after a long power-off period (e.g., the data written before the power-off can still be read correctly but the data to be written after long power-off may be compromised).

Accordingly, the technology described herein selectively/dynamically activates the enhanced operation instance 22 based on the length of the power-off period. More particularly, if the power-off period is relatively long, embodiments activate the enhanced operation instance 22. If, on the other hand, the power-off period is relatively short, embodiments activate the normal operation instance 20. Such an approach enables the trade-off between operation time, power consumption (e.g., product performance) and retention capability to be optimized. For example, enabling the enhanced operation instance 22 when the power-off period is relatively long improves retention capability, whereas enabling the normal operation instance 20 when the power-off period is relatively short improves operation time, power consumption, performance and/or bandwidth.

Figure 3:
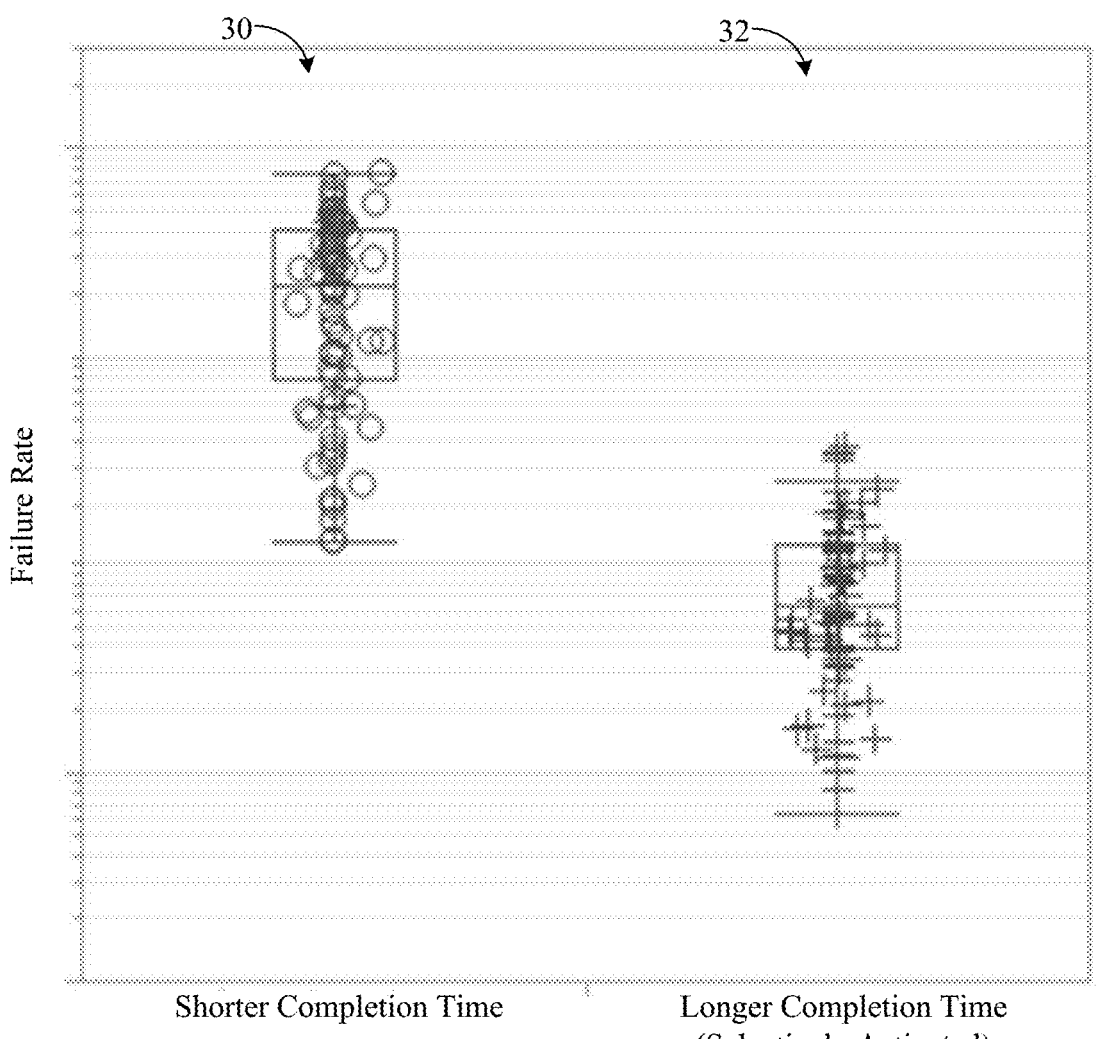
FIG. 3 is a comparative chart of an example of a normal failure rate plot and an extended failure rate plot according to an embodiment.

FIG. 3 shows the effect on the failure rate (e.g., raw bit error rate/RBER) after applying one write operation with an increased write completion time (right) and without an increased write completion time (left). More particularly, an extended failure rate plot 32 shows that with a single write operation having an extended completion time, the failure rate is brought down significantly compared to a normal failure rate plot 30 for a single write operation having a shorter completion time. Increasing the write completion time under all usage conditions, however, has the downside of reducing bandwidth. Thus, the technology described herein dynamically activates the longer completion time based on the length of the power-off period.

Figure 4:
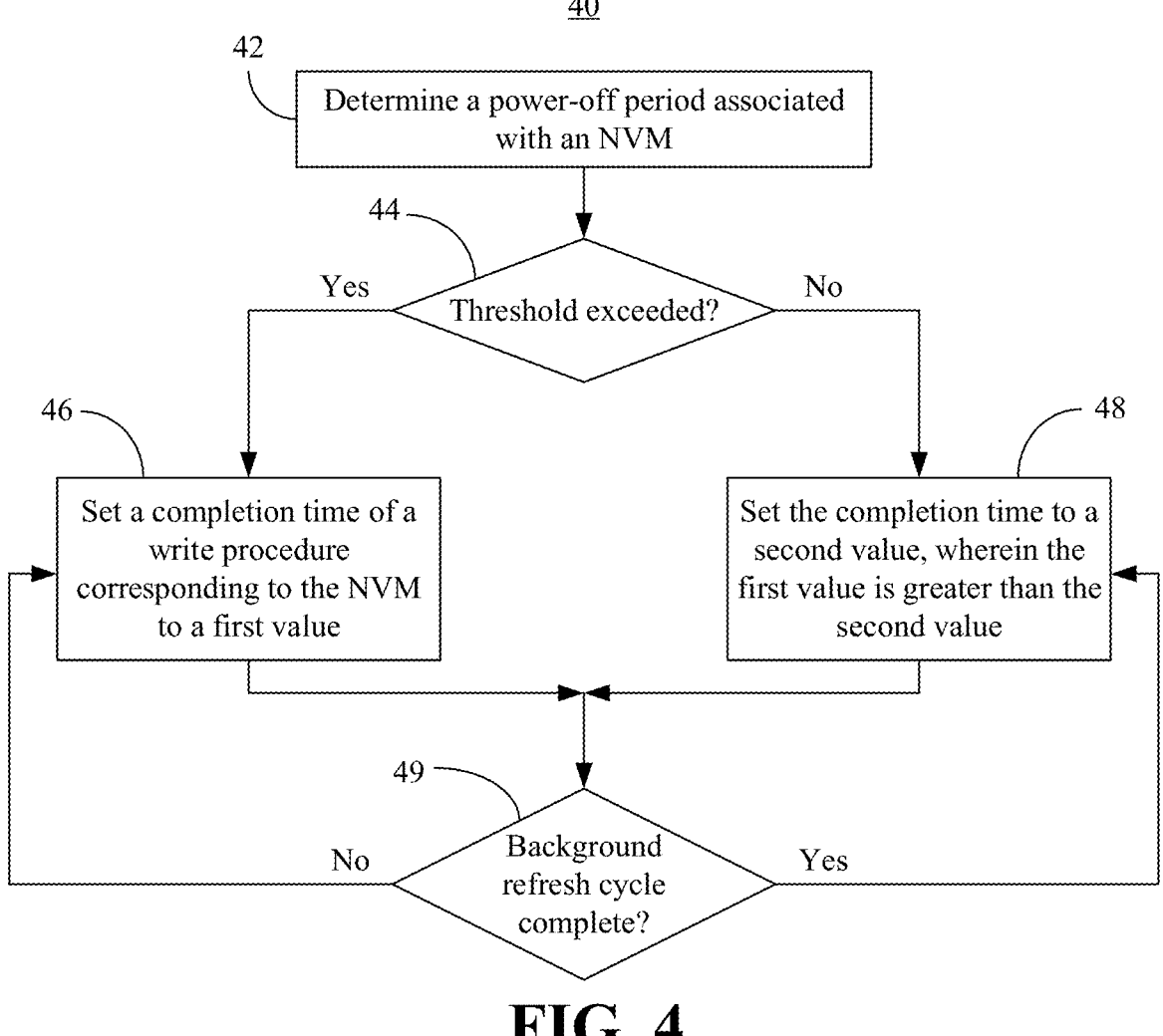
FIG. 4 is a flowchart of an example of a method of operating a memory controller according to an embodiment.

FIG. 4 shows a method 40 of operating a memory controller. The method 40 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic (e.g., configurable hardware), fixed-functionality logic (e.g., fixed-functionality hardware), or any combination thereof. Examples of configurable logic include suitably configured programmable logic arrays (PLAs), field programmable gate arrays (FPGAs), complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 42 provides for determining a power-off period associated with an NVM. In one example, the power-off period is determined in response to a power-on transition in the NVM and the NVM includes a phase change memory. Additionally, block 42 may determine the power-off period based on one or more of a real time clock (RTC) of the NVM or a retry rate of the NVM. With regard to the RTC, block 42 might determine/measure the elapsed time from the last shutdown by comparing the current time of the RTC to a previously stored shutdown time (e.g., timestamp that is stored in accordance with a power safety structure/scheme).

Figure 5:
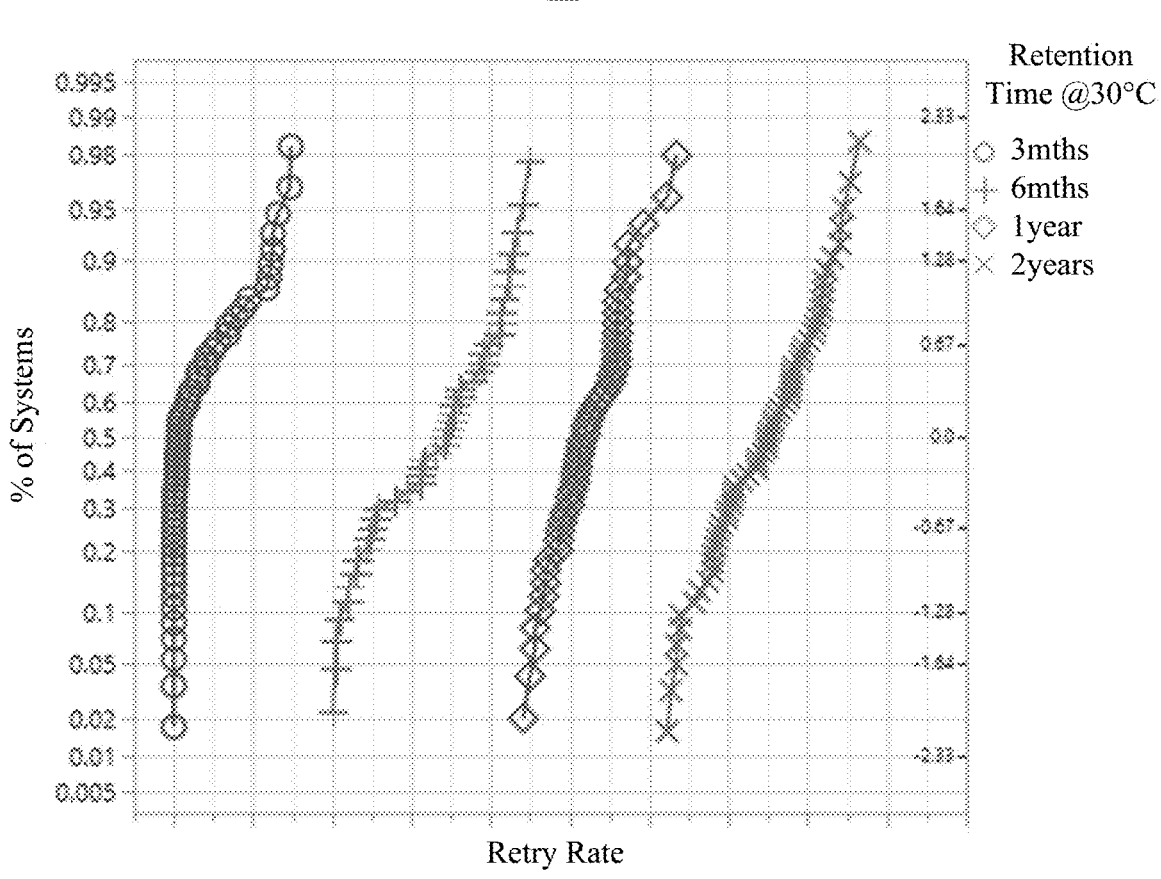
FIG. 5 is a chart of an example of retry rate plots according to an embodiment.

With continuing reference to FIGS. 4 and 5, and regarding the retry rate, the memory device may conduct controlled media read operations with a reference voltage. In such a case, the chosen reference voltage is expected to read the data correctly until the long power-off threshold is reached. If more time has elapsed, read operations are expected to trigger a retry with a higher reference voltage. A chart 50 of retry rate plots demonstrates that the retry rate observed through the issued controlled read operations can be used as a metric to detect a long power-off condition.

A determination is made at block 44 as to whether the power-off period has exceeded a threshold (e.g., long power-off condition). If so, block 46 sets a completion time of a write procedure corresponding to the NVM to a first value. Otherwise, block 48 sets the completion time to a second value, wherein the first value is greater than the second value. Thus, block 46 enables a higher voltage to be provided to target cells in cases of threshold voltage drift due to long power-off periods. Block 46 also enables the bias applied to unselected WLs of unselected cells to be switched from ground to a higher voltage such as, for example, V/3. As will be discussed in greater detail, block 46 may also reduce the length of a background refresh cycle while the completion time is set to the first value.

In one example, block 46 involves sending an operation code (opcode) to the NVM, wherein the opcode is dedicated to the first value (e.g., two unique opcodes for regular and extended completion times). In another example, block 46 sends an opcode to the NVM, wherein the opcode is common to the first value and the second value (e.g., one unique write opcode that can be configured to regular or extended timing), and modifies one or more control settings (e.g., control knobs on the component die to extend the completion time) and scheduler timings (e.g., ASIC scheduler timings to match the extended completion time) based on the first value.

After detecting a long power-off condition and dynamically selecting the longer write completion time, a criterion is defined to switch back to the regular write completion time and recoup system performance. To manage power-on retention, phase change memory products typically use a periodic background refresh operation to write every address at least once every few hours. Accordingly, block 49 may determine whether the background refresh cycle has completed. If so, the illustrated method 40 returns to block 48 and switches the completion time from the first value to the second value.

Given that there is high benefit in recouping performance as quickly as possible, the background refresh rate can be optimized to complete faster when a long power-off condition is detected. For example, instead of refreshing the entire address space in twelve hours, the refresh time can be made as fast as the refresh engine hardware module can support (e.g., thirty minutes). Accordingly, the nominal performance can be achieved again faster. Thus, if it is determined at block 49 that the background refresh cycle is not complete, the illustrated method 40 returns to block 46, which may maintain the length of the background refresh cycle at a reduced level while the completion time is set to the first value. The method 40 therefore enhances performance at least to the extent that dynamically modifying the write procedure completion time enables the trade-off between operation time, power consumption (e.g., product performance), bandwidth and retention capability to be optimized.

Figures 6, 7:
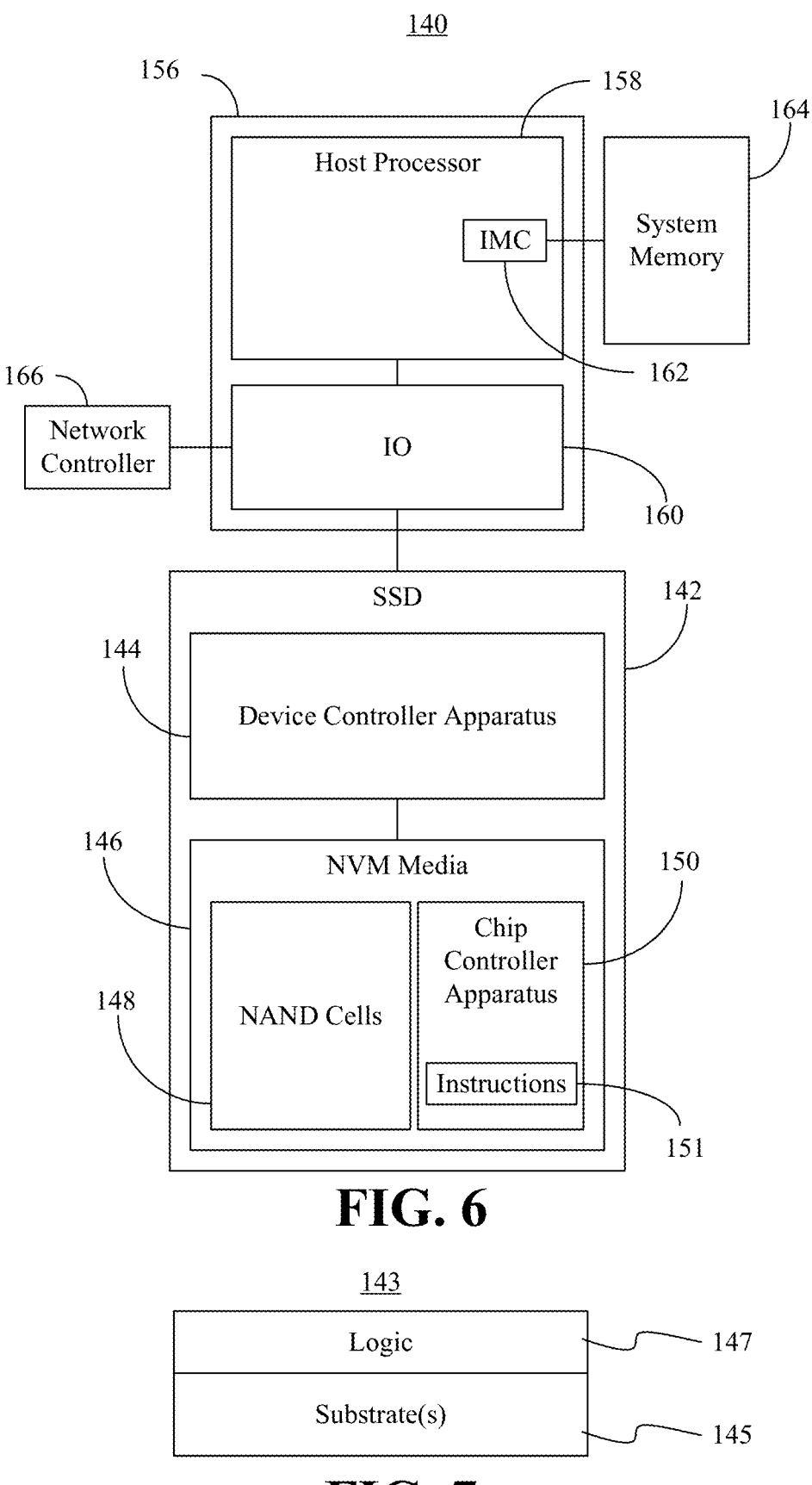
FIG. 6 is a block diagram of an example of a computing system according to an embodiment.
FIG. 7 is an illustration of an example of a semiconductor package according to an embodiment.

FIG. 6 shows a computing system 140. The system 140 may be part of a server (e.g., datacenter, cloud computing infrastructure), desktop computer, notebook computer, tablet computer, convertible tablet, smart television (TV), personal digital assistant (PDA), mobile Internet device (MID), smart phone, wearable device, media player, vehicle, robot, Internet of Things (IoT) device, drone, autonomous vehicle, etc., or any combination thereof. In the illustrated example, an input/output (IO) module 160 is communicatively coupled to a solid state drive (SSD) 142 and a network controller 166 (e.g., wired, wireless).

The system 140 may also include a host processor 158 (e.g., central processing unit/CPU) that includes an integrated memory controller (WIC) 162, wherein the illustrated WIC 162 communicates with a system memory 164 (e.g., DRAM) over a bus or other suitable communication interface. The host processor 158 and the IO module 160 are integrated onto a shared semiconductor die 156 in a system on chip (SoC) architecture.

The SSD 142 may include a device controller apparatus 144 coupled to non-volatile memory (NVM) media 146 such as, for example, a three-dimensional (3D) crosspoint memory device including single- or multi-level phase change memory. The 3D crosspoint memory may comprise a transistor-less stackable crosspoint architecture in which memory cells sit at the intersection of word-lines and bit-lines and are individually addressable and in which bit storage is based on a change in bulk resistance. In an embodiment, the NVM media 146 includes a chip controller apparatus 150 (e.g., memory controller) coupled to a plurality of NAND cells 148. In an embodiment, the chip controller apparatus 150 includes a set of instructions 151 to implement one or more aspects of the method 40 (FIG. 4), already discussed. Thus, execution of the instructions 151 may cause the chip controller apparatus 150 to determine a power-off period associated with the NVM media 146, set a completion time of a write procedure corresponding to the NVM media 146 to a first value if the power-off period exceeds a threshold, and set the completion time to a second value if the power-off period does not exceed the threshold, wherein the first value is greater than the second value. In one example, the first value provides enough time for a higher voltage to be provided to target cells and the bias applied to unselected WLs of unselected cells to be switched from ground to a higher voltage. The chip controller apparatus 150 is therefore considered performance-enhanced at least to the extent that dynamically modifying the write procedure completion time enables the trade-off between operation time, power consumption (e.g., product performance), bandwidth and retention capability to be optimized.

FIG. 7 shows a semiconductor apparatus 143 (e.g., chip, die) that includes one or more substrates 145 (e.g., silicon, sapphire, gallium arsenide) and logic 147 (e.g., transistor array and other integrated circuit/IC components) coupled to the substrate(s) 145. The logic 147, which may be implemented at least partly in configurable and/or fixed-functionality hardware, may generally implement one or more aspects of the method 40 (FIG. 4), already discussed. Thus, the logic 147 may determine a power-off period associated with an NVM, set a completion time of a write procedure corresponding to the NVM to a first value if the power-off period exceeds a threshold, and set the completion time to a second value if the power-off period does not exceed the threshold, wherein the first value is greater than the second value.

In one example, the logic 147 includes transistor channel regions that are positioned (e.g., embedded) within the substrate(s) 145. Thus, the interface between the logic 147 and the substrate(s) 145 may not be an abrupt junction. The logic 147 may also be considered to include an epitaxial layer that is grown on an initial wafer of the substrate(s) 145.

Additional Notes and Examples

Example 1 includes a performance-enhanced memory controller comprising one or more substrates and logic coupled to the one or more substrates, wherein the logic is implemented at least partly in one or more of configurable or fixed-functionality hardware, the logic to determine a power-off period associated with a non-volatile memory (NVM), set a completion time of a write procedure corresponding to the NVM to a first value if the power-off period exceeds a threshold, and set the completion time to a second value if the power-off period does not exceed the threshold, wherein the first value is greater than the second value.

Example 2 includes the memory controller of Example 1, wherein the power-off period is determined based on one or more of a real time clock of the NVM or a retry rate of the NVM.

Example 3 includes the memory controller of Example 1, wherein to set the completion time to the first value, the logic is to send an operation code to the NVM, and wherein the operation code is dedicated to the first value.

Example 4 includes the memory controller of Example 1, wherein to set the completion time to the first value, the logic is to send an operation code to the NVM, wherein the operation code is common to the first value and the second value, and modify one or more control settings and scheduler timings based on the first value.

Example 5 includes the memory controller of Example 1, wherein the logic is to detect a completion of a background refresh cycle in the NVM, and switch the completion time from the first value to the second value in response to the completion of the background refresh cycle.

Example 6 includes the memory controller of Example 5, wherein the logic is to reduce a length of the background refresh cycle while the completion time is set to the first value.

Example 7 includes the memory controller of any one of Examples 1 to 6, wherein the power-off period is determined in response to a power-on transition in the NVM, and wherein the NVM includes a phase change memory.

Example 8 includes at least one computer readable storage medium comprising a set of instructions, which when executed by a memory controller, cause the memory controller to determine a power-off period associated with a non-volatile memory (NVM), set a completion time of a write procedure corresponding to the NVM to a first value if the power-off period exceeds a threshold, and set the completion time to a second value if the power-off period does not exceed the threshold, wherein the first value is greater than the second value.

Example 9 includes the at least one computer readable storage medium of Example 8, wherein the power-off period is determined based on one or more of a real time clock of the NVM or a retry rate of the NVM.

Example 10 includes the at least one computer readable storage medium of Example 8, wherein to set the completion time to the first value, the instructions, when executed, cause the memory controller to send an operation code to the NVM, and wherein the operation code is dedicated to the first value.

Example 11 includes the at least one computer readable storage medium of Example 8, wherein to set the completion time to the first value, the instructions, when executed, cause the memory controller to send an operation code to the NVM, wherein the operation code is common to the first value and the second value, and modify one or more control settings and scheduler timings based on the first value.

Example 12 includes the at least one computer readable storage medium of Example 8, wherein the instructions, when executed, further cause the memory controller to detect a completion of a background refresh cycle in the NVM, and switch the completion time from the first value to the second value in response to the completion of the background refresh cycle.

Example 13 includes the at least one computer readable storage medium of Example 12, wherein the instructions, when executed, further cause the memory controller to reduce a length of the background refresh cycle while the completion time is set to the first value.

Example 14 includes the at least one computer readable storage medium of any one of Examples 8 to 13, wherein the power-off period is determined in response to a power-on transition in the NVM, and wherein the NVM includes a phase change memory.

Example 15 includes a computing system comprising a non-volatile memory (NVM), and a memory controller coupled to the NVM, wherein the memory controller includes logic implemented at least partly in one or more of configurable or fixed-functionality hardware, the logic to determine a power-off period associated with the NVM, set a completion time of a write procedure corresponding to the NVM to a first value if the power-off period exceeds a threshold, and set the completion time to a second value if the power-off period does not exceed the threshold, wherein the first value is greater than the second value.

Example 16 includes the computing system of Example 15, wherein the power-off period is determined based on one or more of a real time clock of the NVM or a retry rate of the NVM.

Example 17 includes the computing system of any one of Examples 15 to 16, wherein the logic is to detect a completion of a background refresh cycle in the NVM, and switch the completion time from the first value to the second value in response to the completion of the background refresh cycle.

Example 18 includes a method of operating a memory controller, the method comprising determining a power-off period associated with a non-volatile memory (NVM), setting a completion time of a write procedure corresponding to the NVM to a first value if the power-off period exceeds a threshold, and setting the completion time to a second value if the power-off period does not exceed the threshold, wherein the first value is greater than the second value.

Example 19 includes the method of Example 18, wherein the power-off period is determined based on one or more of a real time clock of the NVM or a retry rate of the NVM.

Example 20 includes the method of any one of Examples 18 to 19, further comprising detecting a completion of a background refresh cycle in the NVM, and switching the completion time from the first value to the second value in response to the completion of the background refresh cycle.

Example 21 includes an apparatus comprising means for performing the method of any one of Examples 18 to 20.

The technology described herein therefore enables a memory component to operate at peak sustainable bandwidth. Only in the scenario where the component is placed on the shelf as a spare part for long period of time is a longer write completion time activated.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory controller comprising:

one or more substrates; and logic coupled to the one or more substrates, wherein the logic is implemented at least partly in one or more of configurable or fixed-functionality hardware, the logic to:

determine a power-off period associated with a non-volatile memory (NVM);

set a completion time of a write procedure for the NVM to a first value if the power-off period exceeds a threshold; and set the completion time to a second value if the power-off period does not exceed the threshold, wherein the first value is greater than the second value; and wherein the second value for the completion time of the write procedure is to provide a normal time to charge unselected cells a standard value, and the first value for the completion time of the write procedure is to provide a longer time to charge unselected cells to a value higher than the standard value for a write after the power-off period exceeds the threshold.

2. The memory controller of claim 1, wherein the power-off period is determined based on one or more of a real time clock of the NVM or a retry rate of the NVM.

3. The memory controller of claim 1, wherein to set the completion time to the first value, the logic is to send an operation code to the NVM, and wherein the operation code is dedicated to the first value.

4. The memory controller of claim 1, wherein to set the completion time to the first value, the logic is to:

send an operation code to the NVM, wherein the operation code is common to the first value and the second value; and modify one or more control settings and scheduler timings based on the first value.

5. The memory controller of claim 1, wherein the logic is to:

detect a completion of a background refresh cycle in the NVM; and switch the completion time from the first value to the second value in response to the completion of the background refresh cycle.

6. The memory controller of claim 5, wherein the logic is to reduce a length of the background refresh cycle while the completion time is set to the first value.

7. The memory controller of claim 1, wherein the power-off period is determined in response to a power-on transition in the NVM, and wherein the NVM includes a phase change memory.

8. At least one computer readable storage medium comprising a set of instructions, which when executed by a memory controller, cause the memory controller to:

determine a power-off period associated with a non-volatile memory (NVM);

set a completion time of a write procedure for the NVM to a first value if the power-off period exceeds a threshold; and set the completion time to a second value if the power-off period does not exceed the threshold, wherein the first value is greater than the second value; and wherein the second value for the completion time of the write procedure is to provide a normal time to charge unselected cells a standard value, and the first value for the completion time of the write procedure is to provide a longer time to charge unselected cells to a value higher than the standard value for a write after the power-off period exceeds the threshold.

9. The at least one computer readable storage medium of claim 8, wherein the power-off period is determined based on one or more of a real time clock of the NVM or a retry rate of the NVM.

10. The at least one computer readable storage medium of claim 8, wherein to set the completion time to the first value, the instructions, when executed, cause the memory controller to send an operation code to the NVM, and wherein the operation code is dedicated to the first value.

11. The at least one computer readable storage medium of claim 8, wherein to set the completion time to the first value, the instructions, when executed, cause the memory controller to:

send an operation code to the NVM, wherein the operation code is common to the first value and the second value; and modify one or more control settings and scheduler timings based on the first value.

12. The at least one computer readable storage medium of claim 8, wherein the instructions, when executed, further cause the memory controller to:

detect a completion of a background refresh cycle in the NVM; and switch the completion time from the first value to the second value in response to the completion of the background refresh cycle.

13. The at least one computer readable storage medium of claim 12, wherein the instructions, when executed, further cause the memory controller to reduce a length of the background refresh cycle while the completion time is set to the first value.

14. The at least one computer readable storage medium of claim 8, wherein the power-off period is determined in response to a power-on transition in the NVM, and wherein the NVM includes a phase change memory.

15. A computing system comprising:

a non-volatile memory (NVM); and a memory controller coupled to the NVM, wherein the memory controller includes logic implemented at least partly in one or more of configurable or fixed-functionality hardware, the logic to:

determine a power-off period associated with the NVM, set a completion time of a write procedure for the NVM to a first value if the power-off period exceeds a threshold, and set the completion time to a second value if the power-off period does not exceed the threshold, wherein the first value is greater than the second value, and wherein the second value for the completion time of the write procedure is to provide a normal time to charge unselected cells a standard value, and the first value for the completion time of the write procedure is to provide a longer time to charge unselected cells to a value higher than the standard value for a write after the power-off period exceeds the threshold.

16. The computing system of claim 15, wherein the power-off period is determined based on one or more of a real time clock of the NVM or a retry rate of the NVM.

17. The computing system of claim 15, wherein the logic is to:

detect a completion of a background refresh cycle in the NVM, and switch the completion time from the first value to the second value in response to the completion of the background refresh cycle.

18. A method comprising:

determining a power-off period associated with a non-volatile memory (NVM);

setting a completion time of a write procedure for the NVM to a first value if the power-off period exceeds a threshold; and setting the completion time to a second value if the power-off period does not exceed the threshold, wherein the first value is greater than the second value; and wherein the second value for the completion time of the write procedure is to provide a normal time to charge unselected cells a standard value, and the first value for the completion time of the write procedure is to provide a longer time to charge unselected cells to a value higher than the standard value for a write after the power-off period exceeds the threshold.

19. The method of claim 18, wherein the power-off period is determined based on one or more of a real time clock of the NVM or a retry rate of the NVM.

20. The method of claim 18, further comprising:

detecting a completion of a background refresh cycle in the NVM; and switching the completion time from the first value to the second value in response to the completion of the background refresh cycle.

* * * * *